US006894006B1

(12) United States Patent
Maroni et al.

(10) Patent No.: US 6,894,006 B1
(45) Date of Patent: May 17, 2005

(54) METHOD FOR FORMING BISMUTH-BASED SUPERCONDUCTING CERAMICS

(75) Inventors: Victor A. Maroni, Naperville, IL (US); Nazarali N. Merchant, Chicago, IL (US); Ronald D. Parrella, Holden, MA (US)

(73) Assignees: University of Chicago, Chicago, IL (US); American Superconductor Corp., Westborough, MA (US)

( * ) Notice: Subject to any disclaimer, the term of this patent is extended or adjusted under 35 U.S.C. 154(b) by 396 days.

(21) Appl. No.: 10/031,525

(22) PCT Filed: Jul. 21, 2000

(86) PCT No.: PCT/US00/20047

§ 371 (c)(1),
(2), (4) Date: Apr. 9, 2002

(87) PCT Pub. No.: WO01/07378

PCT Pub. Date: Feb. 1, 2001

Related U.S. Application Data

(60) Provisional application No. 60/145,579, filed on Jul. 23, 1999.

(51) Int. Cl.[7] .................... H01B 12/00; C04B 101/00
(52) U.S. Cl. .................... 505/121; 505/450; 505/501; 505/124
(58) Field of Search ................. 505/121, 450, 505/501, 785, 124

(56) References Cited

U.S. PATENT DOCUMENTS

| 5,376,623 A | | 12/1994 | Tsai et al. | |
|---|---|---|---|---|
| 5,468,566 A | * | 11/1995 | Dorris et al. | 428/592 |
| 5,635,456 A | * | 6/1997 | Riley et al. | 505/501 |
| 5,798,318 A | * | 8/1998 | Li et al. | 505/501 |

* cited by examiner

Primary Examiner—Mark Kopec
(74) Attorney, Agent, or Firm—Emrich & Dithmar, LLC.

(57) ABSTRACT

A method for reducing the concentration of non-superconducting phases during the heat treatment of Pb doped Ag/Bi-2223 composites having Bi-2223 and Bi-2212 superconducting phases is disclosed. A Pb doped Ag/Bi-2223 composite having Bi-2223 and Bi-2212 superconducting phases is heated in an atmosphere having an oxygen partial pressure not less than about 0.04 atmospheres and the temperature is maintained at the lower of a non-superconducting phase take-off temperature and the Bi-2223 superconducting phase grain growth take-off temperature. The oxygen partial pressure is varied and the temperature is varied between about 815° C. and about 835° C. to produce not less than 80 percent conversion to Pb doped Bi-2223 superconducting phase and not greater than about 20 volume percent non-superconducting phases. The oxygen partial pressure is preferably varied between about 0.04 and about 0.21 atmospheres. A product by the method is disclosed.

14 Claims, 6 Drawing Sheets

METHOD FOR FORMING BISMUTH-BASED SUPERCONDUCTING CERAMICS

RELATED APPLICATIONS

This application claims priority under 35 U.S.C. §1.19(e)(1) provisional application Ser. No. 60/145,579 filed Jul. 23, 1999, the entire contents of which are incorporated herein by reference.

ORIGIN OF INVENTION

The United States Government has rights in this invention pursuant to Contract No. W-31-109-ENG-38 between the U.S. Department of Energy and The University of Chicago representing Argonne National Laboratory.

TECHNICAL FIELD

This invention relates to a new method of forming bismuth-based superconducting ceramics to reduce the concentration and size of non-superconducting phases normally produced during the formation of the bismuth-based superconductors. By reducing the concentration and size of the non-superconducting phases and controlling the chemistry of the non-superconducting phases, it is believed that an increase in current carrying capacity will be obtained.

BACKGROUND

The commercialization of high-critical temperature superconducting (HTS) devices for electric power applications is presently stalled by a hiatus in the advancement of the current-carrying capacity of long-length conductors. In the case of the silver-sheathed $(Bi,Pb)_2Sr_2Ca_2Cu_3O_y$ (Ag/Bi-2223) composite conductor the critical current density appears to be limited by interruptions in the Bi-2223 grain colony microstructure. Whereas, uniform thin (sub-micron) films of Bi-2223 deposited on smooth substrates have been found to carry in excess of 1,000 kA/cm$^2$ of superconductor at 77 K, the best Ag/Bi-2223 composites seldom exceed 70 kA/cm$^2$ at 77 K. Examination of some of the better performing Ag/Bi-2223 composites shows that the Bi-2223 grain colony microstructure is disrupted in many places by large non-superconducting second phases (NSPs) that are created as side products of the Bi-2223 formation reaction. What is needed is a heat treatment protocol that either eliminates the NSPs or reduces whatever NSPs there are to the smallest possible size (preferably sub-micron).

SUMMARY OF THE INVENTION

This invention relates to the discovery of certain non-obvious but highly beneficial processing steps that, when implemented during the initial stages of the heat treatment of Ag/Bi-2223 composites, cause a reduction in the concentration and size of NSPs in the fully processed (final) product. More particularly, this invention relates to a thermal heat treatment for reducing the size and concentration of NSPs and for controlling the chemistries thereof.

An object of this invention is to provide a method of improving the current densities of Bi-2223 wires.

Another object of this invention is to provide a method of controlling the concentration and size of NSPs in Bi-2223 wire by controlling the oxygen partial pressure as by systematically varying same and the temperature during heat treatment to produce a Bi-2223 material having less than about 20% by volume of NSPs.

Yet another object of this invention is to provide a method of controlling the chemistry of the NSPs produced to ensure that the majority of the NSPs produced are $(Ca,Sr)_2CuO_3$ and $(Ca,Sr)_{14}Cu_{24}O_{41}$.

A further object of this invention is to provide a high temperature superconducting wire of Bi-2223 having less than about 10 v/o NSPs.

A still further object of this invention is to provide a high temperature superconducting wire of Bi-2223 in which substantially all of the NSPs are such that the longest dimension of the NSP particles is about 2 microns or less, preferably less than about 1 micron.

BRIEF DESCRIPTION OF THE DRAWINGS

The invention consists of certain novel features and a combination of parts hereinafter fully described, illustrated In the accompanying drawings, it being understood that various changes in the details may be made without departing from the spirit, or sacrificing any of the advantages of the present invention.

DETAILED DESCRIPTION OF INVENTION

Our current understanding of these NSPs is that their composition can be controlled to a certain extent by judicious choice of the oxygen partial pressure (pO$_2$) and temperature used in the reactive sintering of drawn/rolled Ag/Bi-2223 precursors.

It seems particularly advantageous for this diminishment of the NSPs to take place during the heat treatment of growth of Bi-2223 colonies. More particularly, the diminishment of the NSPs can take place during the first heat treatment (HT-1) which precedes a deformation treatment employed to remove the porosity in the HTS ceramic caused by the retrograde densification that takes place in conjunction with Bi-2223 phase formation during the first heat treatment.

Figure 1:
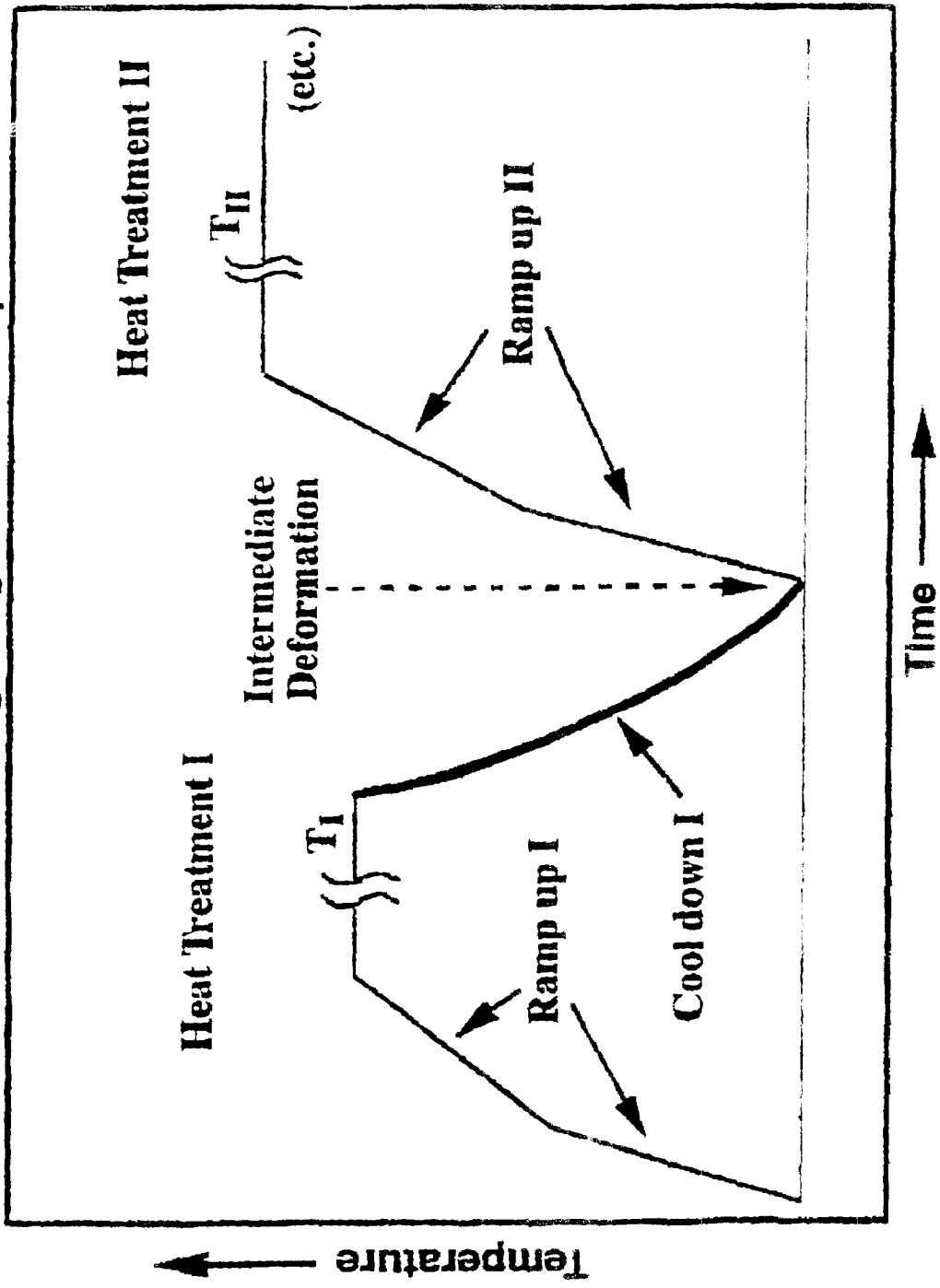
FIG. 1 is a graph showing the relationship between temperature and time for the thermal mechanical processing of Ag/Bi-2223 composite conductors.

FIG. 1 shows typical heat treatment for the thermal mechanical processing of Ag/Bi2223 composite conductors. There is an initial heat treatment followed by an interactive process of deformation and heat treatment steps(s). The subject invention relates to a protocol for the first heat treatment. One of the objects of the present invention is to reduce the longer dimension of non-superconducting second phase particles to less than about 2 microns. It is also as previously stated an object of the invention to the reduce the concentration of these particles and to control the chemistry of these particles.

Figure 2:
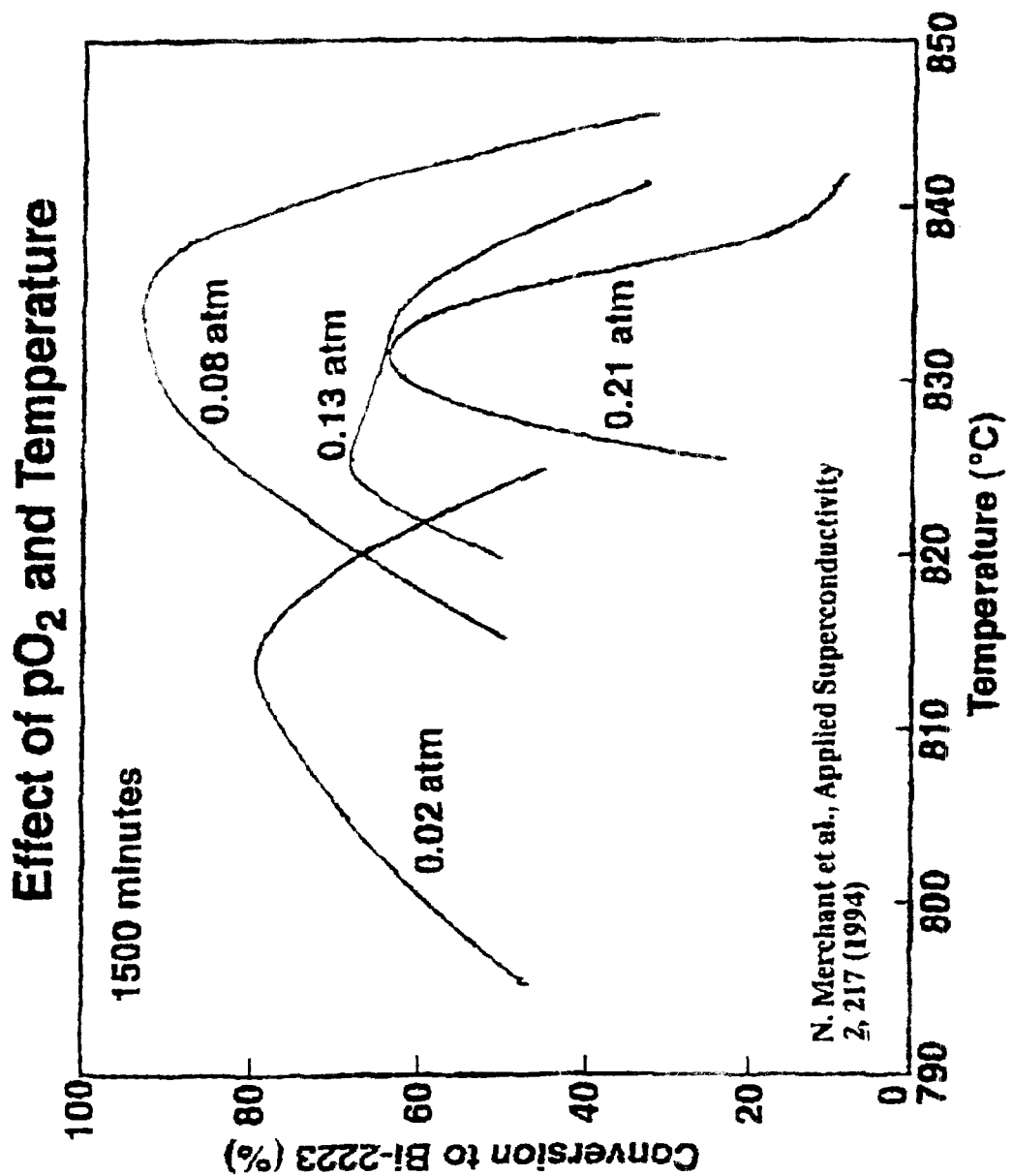
FIG. 2 is a graph showing the relationship between the percent conversion of Bi-2223 and temperature for various oxygen partial pressures.

FIG. 2 shows the relationship of the conversion of Bi-2223 and temperature for various oxygen partial pressures. These data are part of the prior art as is the representation in FIG. 1.

Figure 3:
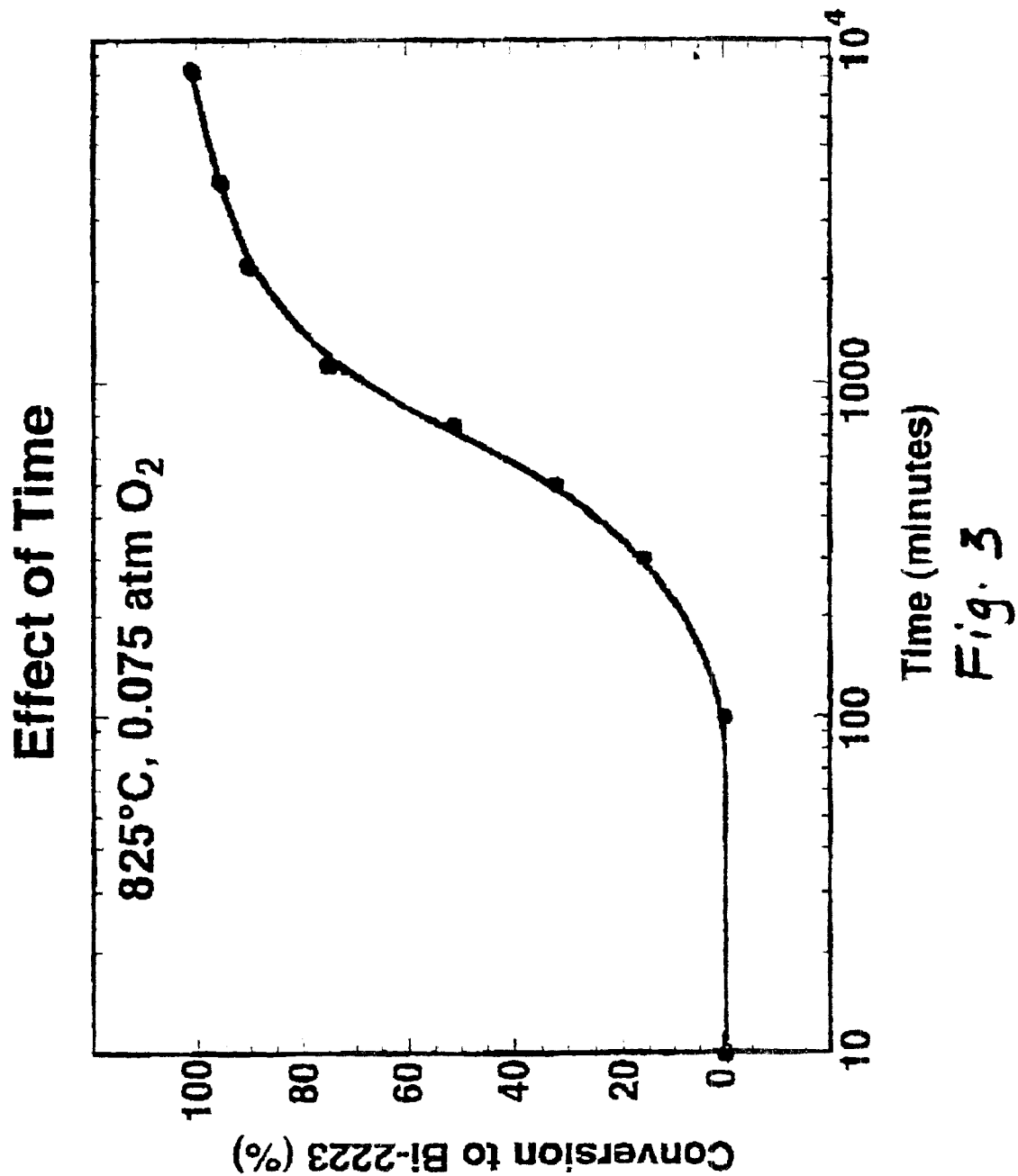
FIG. 3 is a graph illustrating the relationship between the conversion of Bi-2223 and time for a given temperature and oxygen partial pressure.

FIG. 3 shows the relationship of the conversion of Bi-2223 particles by heat treatment at 825° C. and 0.075 atmospheres oxygen partial pressure as a function of time. We have found that the first heat treatment, preferably, the Bi-2223 conversion content is between about 65–95% moves preferably between 80 and 90% and most preferably about 85% (e.g. 85 volume percent) when there remains both Bi-2212 and non-superconducting phase particles. The reason is that during a subsequent heat treatment of the material, there should be sufficient Bi-2212 material available to combine with the non-superconducting phases to form Bi-2223. If insufficient Bi-2212 material is available, then there may not be anything or an insufficient amount for the non-superconducting phase material to react or combine with. It is understood that the non-superconducting phase material is deleterious to the overall current carrying capacity of the conductor because it is hard and it reduces the amount of material capable of being superconducting at operating temperatures.

It is understood that during the reduction in concentration of the NSPs, composition of the NSPs (non-superconducting phases), can be, according to the present invention, controlled. That is, ordinarily CuO, $(CaSr)_2CuO_3$ and $(CaSr)_{14}Cu_{24}O_{41}$ are present as NSPs.

For example, at higher $pO_2$ and temperatures (e.g. 0.21 atm and 835° C.), the concentrations of the 2/1 ratio (e.g. $(CaSr)_2 CO_3$) and CuO can be reduced. At lower $pO_2$ and temperature (such as 0.04 atm and 815° C.), the concentration of 14/24 material can be reduced.

By varying the $pO_2$ and temperature within a specified range, one can therefore control the concentrations of the individual NSPs during the reaction.

Figure 4:
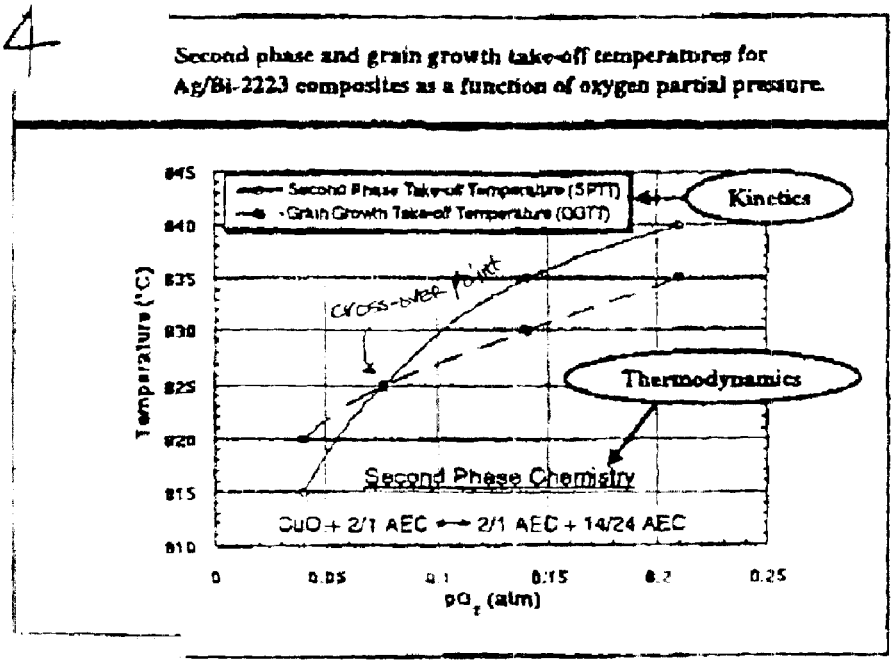
FIG. 4 is a graph showing the relationship between the second phase (NSPs) and grain growth take-off temperatures for Ag/Bi-2223 composites as a function of oxygen partial pressure.

In the course of extensive studies of how temperature and $pO_2$ influence phase evolution and microstructure development during the heat treatment of Ag/Bi-2223 composites, we determined that for a given $pO_2$ in the range of $pO_2$'s where the Bi-2223 phase has appreciable stability (nominally 0.04 to 0.21 atm), there is an onset temperature for the growth of robust Bi-2223 grain colonies (a desirable effect) and another onset temperature for the persistent formation of large NSPs (an undesirable effect). We refer to these two temperatures as the grain growth takeoff temperature (GGTT) and the second phase takeoff temperature (SPTT), respectively. Ideally, we want the GGTT to be well below the SPTT, but as FIG. 4 shows, this is not generally the case. At the lower $pO_2$ (e.g. about 0.04 atm), the SPTT is lower than the GGTT, and at about 0.075 atm $O_2$, the SPTT is approximately equal to GGTT. However, at the higher $pO_2$'s SPTT is slightly greater than GGTT.

The other important discovery we have made in conjunction with the data in FIG. 4 is that the composition of the NSPs varies significantly with $pO_2$ and temperature from a CuO dominated mix at low $pO_2$ to a $(Ca,Sr)_2CuO_3$ dominated mix at intermediate $pO_2$ to a $(Ca,Sr)_{14}Cu_{24}O_{41}$ dominated mix at higher $pO_2$ (e.g. 0.21 atm). This discovery implies that it is possible to manipulate the constituent species of the NSP mix within the range of $pO_2$'s where the Bi-2223 phase has appreciable stability. This is accomplished by sliding along the GGTT curve between about 0.075 atm and about 0.21 atm $O_2$ and/or along the SPTT curve between about 0.04 atm and about 0.075 atm $O_2$. Accordingly, we have carried out first heat treatments on Ag/Bi-2223 composite specimens using several different combinations of $pO_2$ and temperature on the GGTT/SPTT lower bound in FIG. 4. A typical sliding heat treatment of this type (hereinafter call Thermal Slide Heat Treatment or TSHT) generally includes the following sequence of steps:

1. ramping the temperature up to 800° C. at 10° C./minute, then up to, e.g., 825° C. at 1° C./minute in 0.075 atm $O_2$, and holding for several hundred to 1000 minutes.
2. raising the temperature and pO2 to 835° C. and 0.21 atm $O_2$, respectively, and holding at those conditions for up to 1000 minutes;
3. shifting the temperature and $pO_2$ to another point on the GGTT/SPTT lower bound (e.g., 815° C. and 0.04 atm $O_2$) and holding for up to 1000 minutes;
4. repeating combinations of the above heat treatments, then terminating the TSHT process by furnace cooling the sample.

The TSHT treatment can be applied to a conventional OPIT (oxide powder in tube) precursor wire fabrication process which includes the following steps: packing an oxide powder with a nominal cation stoichiometry (Bi+Pb)(2):Sr(2):Ca(2):Cu(3) into silver billets, drawing the billets into monofilamentary wires, bundling the monofilamentary wires into a multifilament composite, drawing the bundled composite into a multifilamentary round wire, and roll deforming the round wire into a flat tape.

In some embodiments, it may be desirable to maintain the total Bi-2223 phase conversion preferably between about 80–90% at the end of the TSHT treatment. Following the TSHT treatment further suitable deformation and heat treatment steps can be applied to complete densification and formation of the desired Bi-2223 superconducting phase. Sample tapes can be made by such a process to produce Jc values over 65,000 $A/cm^2$ (77K, self-field).

Figure 6:
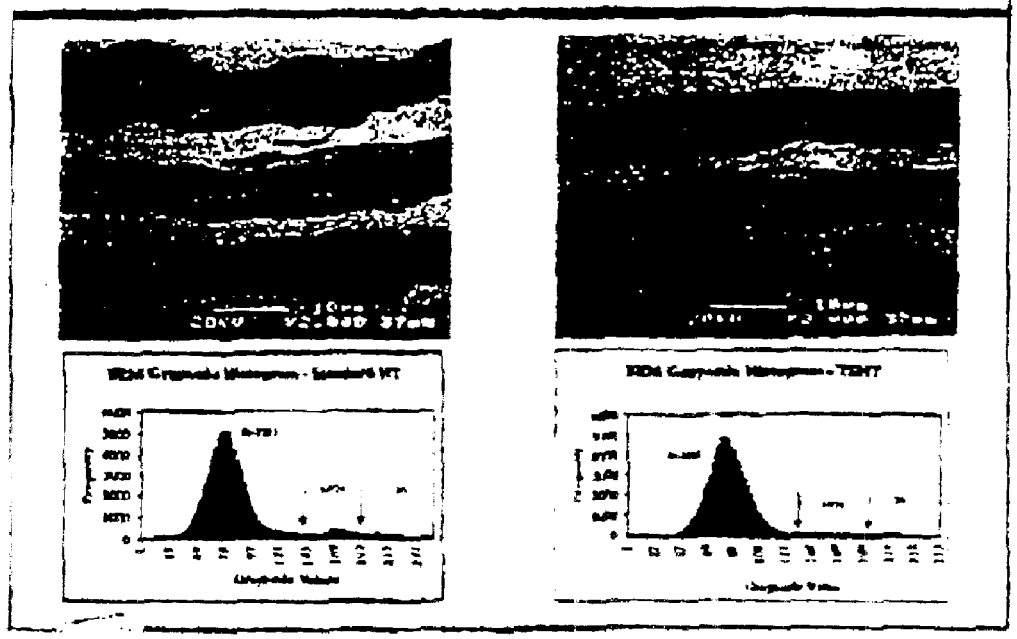
FIG. 6 is a representation of the transverse SEM image analysis of a 19-filament Ag/Bi2223 composite specimen after a standard heat treatment HT-1(left) and a best case TSHT is not defined until later in specification (right) treatment.
Figure 7:
FIG. 7 is a comparison of a standard heat treatment (left) vs. a best case heat treatment according to the invention (right) for a 55 filament production wire.
Figure 7:
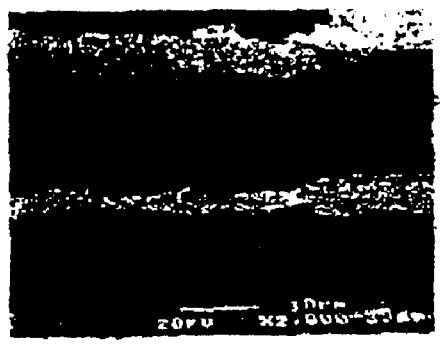
Figure 8:
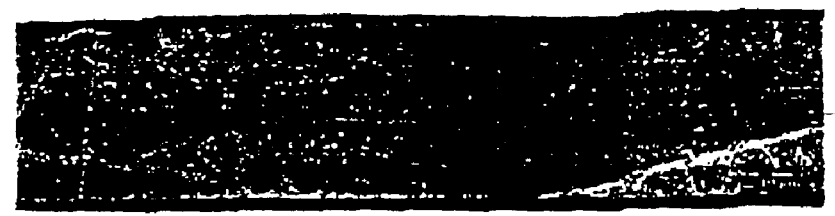
FIG. 8 is a full transfer sectional view of a 19 filament Bi-2223 composite wire after heat treatment by the invention.
Figure 8:
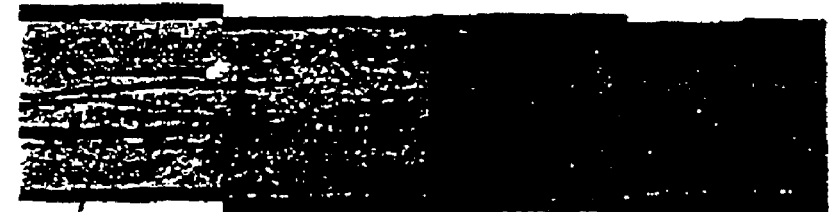

The type of microstructure achieved in one of the best TSHT processing sequences we studied is shown in FIGS. 6, 7 and 8. The scanning electron microscope images in FIG. 6 pictorialize the entire transverse section of a 19 filament Ag/Bi-2223 composite after the TSHT procedure. Only a few second phases larger than a micron are noticeable in most of the 19 filaments in FIG. 6. The phase purity and sparse NSP content exhibited in FIG. 6 are unprecedented for Ag/Bi-2223 composites.

Specific Tests and Results

The following tables outline the types of TSHT process sequences we have investigated, the parameter ranges that apply to each step, the percent of layered phase product that is Bi-2223, and the consequences of the sequence in terms of (1) major nonsuperconducting second phase (NSP) content and composition and (2) grain growth quality.

The information in Tables 1 and 2 represents examples of the types of staged processing sequences that we believe will ultimately lead to a superior Ag/Bi-2223 product. In essence, our TSHT treatment may be a superior substitute for the first heat treatment in the current commercial Ag/Bi-2223 production process. As discussed above, additional interactive steps following the TSHT process that can be utilized include intermediate deformation step(s) (rolling) of the wire to re-densify the core powder after the first heat treatment and a final (finishing) heat treatments carried out to heal the microstructural damage caused by the intermediate deformation.

Preferably, the variation methodology includes the notion that the variations should be made without ever crossing the lower (in terms of temperature) of the GGTT curve or the SPTT curve. This is preferably done (depending on the direction one is moving along the GGTT/SPTT lower bound) by either lowering temperature first then lowering oxygen pressure or raising oxygen pressure first then raising temperature. It will be appreciated by those skilled in the art that work can be done between the GGTT line and the SPTT line where the SPTT curve is higher than the GGTT curve. Termination of the treatment with a furnace cool (versus a rapid quench) is more appropriate for Ag/Bi-2223 wire manufacturing applications, because a rapid quench induces crack-causing stresses in the wire sample.

TABLE 1

TSHT Treatments Involving 0.075 and 0.21 atm $O_2$

| Sequence Type | Step | Heat Treat Parameters(a) T (° C.)/$pO_2$ (atm)/t (min) | Volume Percent Bi-2223(b) | %-NSP//m-NSP//GGQ Observations(c) |
|---|---|---|---|---|
| HT-1 | 1 | 825/0.075/≧1500 | >90% | −<20%//2/1//Good |
| HT-2 | 1 | 835 0.21/≧1500 | ≦60 | −ca.50%//14/24//Good |
| TSHT-1 | 1 | 825/0.075/300 | ? | |
| | 2 | 835/0.21/1000 | ca.84 | −<30%//14/24//Good |
| | 3A | 825/0.075/1500 | ca.90 | −<10%//2/1 + 14/24//Good |
| | 3B | 825/0.075/3000 | ca.99 | −<20%//2/1 + 14/24//Good |
| TSHT-1A | 1 | 820/0.075/300 | ? | |
| | 2 | 830/0.21/1000 | ca.40 | −<20%//14/24//Poor |
| | 3 | 820/0.075/1500 | ca.86 | −<30%//14/24//Fair |
| TSHT-2 | 1 | 835/0.21/1300 | ? | |
| | 2 | 825/0.075/1000 | ca.84 | −<20%//2/1 > 14/24//Good |
| | 3 | 835/0.21/1500 | ca.84 | −<20%//14/24 > 2/1//Good |
| TSHT-3A | 1 | 825/0.075/300 | ? | |
| | 2 | 835/0.21/480 | ? | |
| | 3 | 825/0.075/570 | ca.78 | −>50%//14/24//Poor |
| | 4 | 835/0.021/470 | ? | |
| | 5 | 825/0.075/960 | ? | −<30%//2/1//Good |
| TSHT-3B | 1 | 825/0.075/1080 | ? | |
| | 2 | 835/0.21/360 | ? | |
| | 3 | 825/0.075/100 | ca.88 | −<20%//14/24 > 2/1//Good |
| | 4 | 835/0.21/400 | ? | |
| | 5 | 825/0.075/1080 | ca.94 | −<20%//14/24 + 2/1//Very Good |

(a)T = temperature; $pO_2$ = oxygen pressure; t = time
(b)Percent of the layered phase content (Bi-2223 + Bi-2212 + Bi-2201) that is Bi-2223 (from x-ray diffraction measurement on the mounted/sanded specimen).
(c)%-NSP = area percentage of nonsuperconducting second phase, m-NSP = major nonsuperconducting second phase; GG = grain growth quality; 2/1 = $(Ca,Sr)_2CuO_3$ and 14/24 = $(Ca,Sr)_{14}Cu_{24}O_{41}$.

TABLE 2

TSHT Treatments Involving 0.075 and 0.21 atm $O_2$

| Sequence Type | Step | Heat Treat Parameters(a) T (° C.)/$pO_2$ (atm)/t (min) | Volume Percent Bi-2223(b) | %-NSP//m-NSP//GGQ Observations(c) |
|---|---|---|---|---|
| Base Case-A | 1 | 825/0.075/≧1500 | >90% | −<20%//2/1//Good |
| Base Case-B | 1 | 835/0.21/≧1500 | ca.60 | −ca.50%//14/24//Good |
| Base Case-C | 1 | 815/0.04/12100 | ca.58 | −20%//CuO + 2/1 Poor |
| Base Case-D | 1 | 820/0.04/1200 | ca.40 | −<30%//CuO + 2/1//Poor |
| TSHT-10 | 1 | 825/0.075/300 | ? | |
| | 2 | 815/0.04/1000 | ? | |
| | 3 | 825/0.075/1500 | ? | |
| TSHT-11 | 1 | 825/0.075/300 | ? | |
| | 2 | 835/0.021/1210 | ? | |
| | 3 | 815/0.04/300 | ? | |
| | 4 | 825/0.075/≧900 | ? | −<10%//2/1 > 14/24//Good |
| TSHT-12 | 1 | 825/0.075/240 | ? | |
| | 2 | 835/0.21/180 | ? | |
| | 3 | 825/0.075/960 | ? | −>30%//2/1 + 14/24//Fair |
| | 4 | 815/0.04/180 | ? | |
| | 5 | 835/0.21/260 | ? | |
| | 6 | 825/0.075/960 | ? | −<40%//14/24//Fair |

(a)T = temperature; $pO_2$ = oxygen pressure; t = time
(b)Percent of the layered phase content (Bi-2223 + Bi-2212 + Bi-2201) that is Bi-2223 (from x-ray diffraction measurement on the mounted/sanded specimen).
(c)%-NSP = area percentage of nonsuperconducting second phase, m-NSP = major nonsuperconducting second phase; GG = grain growth quality; 2/1 = $(Ca,Sr)_2CuO_3$ and 14/24 = $(Ca,Sr)_{14}Cu_{24}O_{41}$.

In viewing Tables 1 and 2, the best cases are the ones with the lowest area percentages of NSPs and "good" to "very good" grain growth quality. Examples are TSHT-1 and TSHT-3B.

What we have accomplished with the TSHT type treatment that is not obvious in Tables 1 and 2 is that in addition to achieving a lower area fraction of NSPs (relative to the Base Case results) we also achieve microstructures with considerably fewer large NSPs.

Another typical sliding heat treatment of this type generally consists of the following sequence of steps.

1. ramping the temperature up to 825° C. at 10° C./minute and holding for several hundred to 1000 minutes;
2. shifting the temperature and $pO_2$ to another point on the grain growth take-off temperature (GGTT)/second phase take-off temperature (SPTT) lower bound (e.g., 815° C. and 0.04 atm $O_2$) and holding for several hundred to 1000 minutes;
3. repeating combinations of the above heat treatments, then terminating the TSHT process by furnace cooling the sample.

Results to date for this new processing methodology have revealed several features that may be important. (1) A short duration (ca. 5–6 hour) heat treatment at 825° C. and 0.075 atm $O_2$ is a critical first step. (2) Short duration (ca. 5–6 hour) treatment steps at $pO_2$'s above and below 0.075 atm $O_2$ are important to the process of dissipating the NSPs and the Bi-2223 phase conversion should most preferably be kept to about 85% phase conversion, see FIG. 3, so that some capacity remains to reactively heel deformation-induced damage during the finishing heat treatment that follows the post HT-1 deformation.

Figure 5:
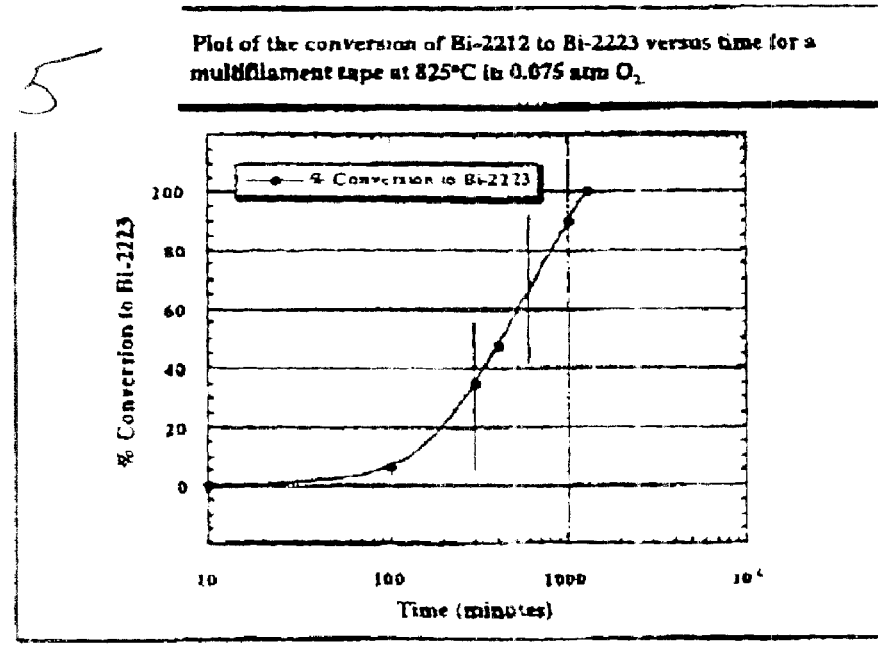
FIG. 5 is a graph showing the relationship between the percent conversion of Bi-2212 to Bi-2223 vs. time for a multi-filament tape at a given temperature and oxygen partial pressure.

We have explored a wide variety of three-step, four-step, and five-step TSHTs. Six different temperature/pO2 set points have been used in various combinations, but usually not more than three different ones in a given TSHT, regardless of the actual number of steps. These set points in °C./atm $O_2$ are: 805/0.02, 815/0.04, 825/0.075, 830/0.14, and 835/0.21. We have explored times ranging from 200 to 1000 minutes at each set point. Guided by the reaction rate data for Bi-2223 formation and detailed knowledge of the phase composition evolution as a function of time at each set point (based on data of the type shown in FIGS. 4 and 5), where the vertical lines in FIG. 5 show examples of locations in the conversion process where set points are varied and another embodiment of the invention is a process laid out below:

Step 1 0.075 atm $O_2$/300 minutes/825° C.
   Gets reaction going; gives ca. 25% conversion of Bi-2212 to Bi-2223.
Step 2 0.21 atm $O_2$/300 minutes/835° C.
   Breaks up 2/1 AEC; shifts NSP equilibrium towards 14/24 AEC.
Step 3 0.075 atm $O_2$/900 minutes/825° C.
   Keeps reaction going; stops 14/24 AEC growth.
Step 4 0.04 atm $O_2$/200 minutes/815° C.
   Dissipates 14/24 AEC.
Step 5 0.075 atm $O_2$/1000 minutes/825° C.
   Finishing treatment to force Bi-2223 formation reaction to ca. 85% completion and continue dissipation of NSPs.

A comparison of the microstructure of typically processed Ag/Bi-2223 with the type of microstructure achieved using the "best case" TSHT 5step processing sequence outlined above is shown in FIG. 6. The scanning electron microscope images in these figures pictorialize the transverse section of a 19 filament Ag/Bi-2223 composite after a standard HT-1 and after the "best case" TSHT procedure. A detailed image processing analysis of the entire transverse section (all 19 filaments for both samples) shows that there is less than half as much total NSP in the TSHT sample (in terms of both the total number of NSP particles per unit area of ceramic core and the fractional area of the cores occupied by NSPs) as compared to the typically heat treated sample for the same total processing time. The TSHT sample exhibited a critical superconductor density ($J_c$) of at least 20 $k^A/cm^2$.

We conducted a comparative test using typical processing methods versus the TSHT methodology (like the one in FIG. 6) on segments of one of American Superconductor Corporation (ASC)'s precursor wires in the as-rolled state (i.e., prior to any HT-1 type processing at ASC). The results are presented in FIG. 7. Image processing analysis of the SEM data clearly shows that the typically treated sample has over twice as much NSP as does the TSHT sample. The two SEM images in FIG. 7 actually depict the best domains of the conventionally processed sample (in terms of NSP content) and the worst domains of the TSHT sample. Even with this comparison constraint, the TSHT sample has fewer NSPs than the conventionally processed sample.

While there has been disclosed what is considered to be the preferred embodiment of the present invention, it is understood that various changes in the details may be made without departing from the spirit, or sacrificing any of the advantages of the present invention.

The embodiments of the invention in which an exclusive property or privilege is claimed are defined as follows:

1. In a method for producing a Pb doped Bi-2223 superconductor including multiple heating steps, the improvement comprising reducing the concentration of non-superconducting phases during the initial heat treatment of Pb doped Ag/Bi-2223 composites having Bi-2223 and Bi-2212 superconducting phases by, providing a Pb doped Ag/Bi-2223 composite having Bi-2223 and Bi-2212 superconducting phases, heating the composite in an atmosphere having an oxygen partial pressure not less than about 0.04 atmospheres, maintaining the temperature at the lower of a non-superconducting phase take-off temperature and the Bi-2223 superconducting phase grain growth take-off temperature, varying the oxygen partial pressure and/or the temperature between about 815° C. and about 835° C. to produce not less than about 80 percent conversion to Pb doped Bi-2223 superconducting phase and not greater than about 20 volume percent non-superconducting phases, and thereafter continuing treatment of the superconducting material to produce a final product.

2. The method of claim 1, wherein the oxygen partial pressure is varied between about 0.04 and about 0.21 atmospheres during the initial heating step.

3. The method of claim 1, wherein the composites are initially heated up to a temperature of about 825° C. with the rate of temperature increase between about 700° C. and about 825° C being about 10° C./minute.

4. The method of claim 3, wherein the composite is initially heated to about 825° C. and is held at an oxygen partial pressure of about 0.075 atmosphere and maintained thereat for not more than about 300 minutes.

5. The method of claim 1, wherein the composite is initially heated to a temperature of about 835° C. and is held at an oxygen partial pressure of about 0.21 atmospheres for a time not more than about 300 minutes.

6. The method of claim 5, wherein the composite is held at a temperature of about 825° C. and at an oxygen partial pressure of about 0.075 atmospheres for not more than about 900 minutes during the initial heating step.

7. The method of claim 6, wherein the composite is held at a temperature of about 815° C. and at an oxygen partial pressure of about 0.04 atmospheres for not more than about 200 minutes during the initial heating step.

8. The method of claim 7, wherein the composite is held at a temperature of about 825° C. and at an oxygen partial presence of about 0.075 atmosphere for not more than about 1500 minutes during the initial heating step to produce a composite having a superconducting Bi-2223 phase present at about 85 volume percent.

9. The method of claim 8, wherein the non-superconducting second phases and the Bi-2212 superconducting phase are present not to exceed about 10 volume percent after the initial heating step.

10. The method of claim 1, wherein the non-superconducting phases comprise at least one of CuO, $(Ca,Sr)_2CuO_3$ and $(Ca,Sr)_{14}Cu_{24}O_{41}$.

11. The method of claim 10, wherein the initial heating step includes heating the non-superconducting phases at a plurality of discrete temperatures between 815° C. and 835° C. and at oxygen partial pressures from 0.04 to 0.21 atmospheres along the lower of the non-superconducting phase take-off-temperature and the Bi-2223 superconducting phase grain growth take-off temperature to vary the concentrations of CuO, $(Ca,Sr)_2CuO_3$ and $(Ca,Sr)_{14}Cu_{24}O_{41}$.

12. In a method for producing a Pb doped Bi-2223 superconductor including multiple heating steps, the improvement comprising reducing the concentration and particle size of non-superconducting phases produced during the initial heat treatment of Pb doped Ag/Bi-2223 composites, comprising providing a Pb doped Ag/Bi-2223 composite having Bi-2223 and Bi-2212 superconducting phases by, heating the composite in an atmosphere having an oxygen partial pressure in the range of from about 0.04 to about 0.21 atmospheres, and maintaining the temperature at or below a non-superconducting phase take-off temperature when the oxygen partial pressure is less than or equal to the crossover point or at or above the Bi-2223 grain growth take-off temperature but not greater than the non-superconducting take-off temperature when the oxygen partial is greater than the crossover point for a time sufficient to produce not less than about 80 volume percent Pb doped Ag/Bi-2223 phase and not greater than about 20 volume percent non-superconducting phases, and thereafter continuing treatment of the superconducting material to produce a final product, wherein the composite is sequentially heated to 825° C. at an oxygen partial pressure of 0.075 atmosphere and maintained thereat for a time less than about 300 minutes and thereafter maintained at temperatures at or below a non-superconducting phase take-off temperature when the oxygen partial pressure is less than or equal to the cross-over point or at or above the Bi-2223 grain growth take-off temperature but not greater than the non-superconducting take-off temperature when the oxygen partial pressure is greater than the cross-over point and both above and below oxygen partial pressure of 0.075 atmospheres, whereby to reduce the size of the longest dimension of the average non-superconducting particle to less than about two microns.

13. In a method for producing a Pb doped Bi-2223 superconductor including multiple heating steps, the improvement comprising reducing the concentration and particle size of non-superconducting phases including CuO, $(CaSr)_2CuO_3$ and $(Ca,Sr)_{14}Cu_{24}O_{41}$ during the initial heat treatment of Pb doped Ag/Bi-2223 composites, by providing a Pb doped Ag/Bi-2223 composite having Bi-2223 and Bi-2212 superconducting phases, heating the composite in an atmosphere having an oxygen partial pressure in the range of from about 0.04 to about 0.21 atmospheres, and maintaining the temperature below a non-superconducting phase take-off temperature and at or above the Bi-2223 grain growth take-off temperature for a time sufficient to produce not less than about 80 percent conversion to Pb doped Ag/Bi-2223 phase and not greater than about 20 volume percent non-superconducting phase, heating the non-superconducting phase at a plurality of discrete temperatures between 815° C. and 835° C. and at oxygen partial pressures from 0.04 to 0.21 atmospheres along the lower of a non-superconducting phase take-off-temperature and the Bi-2223 superconducting phase grain growth take-off temperature to vary the concentration of CuO and $(Ca,Sr)_2CuO_3$ and $(Ca,Sr)_{14}Cu_{24}O_{41}$, and thereafter maintaining the composite at temperature of about 825° C. at about 0.075 atmospheres oxygen partial pressure for a time sufficient to reduce the concentration of the $(Ca,Sr)_{14}Cu_{24}O_{41}$ phase and to reduce the longest dimension of the average non-superconducting particle size to less than about two microns, and thereafter continuing treatment of the superconducting material to produce a final product.

14. A product produced in the method for producing a Pb doped Bi-2223 superconductor including multiple heating steps, the improvement comprising reducing the concentration of non-superconducting phases during the initial heat treatment of Pb doped Ag/Bi-2223 composites having Bi-2223 and Bi-2212 superconducting phases, by providing a Pb doped Ag/Bi-2223 composite having Bi-2223 and Bi-2212 superconducting phases, heating the composite in an atmosphere having an oxygen partial pressure not less than about 0.04 atmospheres, maintaining the temperature at the lower of a non-superconducting phase take-off temperature and the Bi-2223 superconducting phase grain growth take-off temperature, varying the oxygen partial pressure and/or the temperature between about 815° C. and about 835° C. to produce not less than about 80 percent conversion to Pb doped Bi-2223 superconducting phase and not greater than about 20 volume percent non-superconducting phases and thereafter continuing treatment of the superconducting material to produce a final product.

* * * * *